(12) United States Patent
Kao et al.

(10) Patent No.: US 8,278,712 B2
(45) Date of Patent: Oct. 2, 2012

(54) POWER MOSFET INTEGRATION

(75) Inventors: Jungcheng Kao, San Jose, CA (US);
Yanjun Li, Shanghai (CN)

(73) Assignee: O2Micro Inc., Santa Clara, CA (US)

( * ) Notice: Subject to any disclaimer, the term of this patent is extended or adjusted under 35 U.S.C. 154(b) by 190 days.

(21) Appl. No.: 12/399,276

(22) Filed: Mar. 6, 2009

(65) Prior Publication Data

US 2009/0167662 A1 Jul. 2, 2009

Related U.S. Application Data

(63) Continuation-in-part of application No. 11/903,879, filed on Sep. 25, 2007.

(60) Provisional application No. 61/194,587, filed on Sep. 29, 2008.

(51) Int. Cl.
*H01L 29/772* (2006.01)

(52) U.S. Cl. .............. 257/343; 257/E29.261; 438/286

(58) Field of Classification Search .............. 257/343, 257/E29.261; 438/286
See application file for complete search history.

(56) References Cited

U.S. PATENT DOCUMENTS

| | | | | |
|---|---|---|---|---|
| 5,156,989 A * | 10/1992 | Williams et al. | | 438/206 |
| 5,204,541 A * | 4/1993 | Smayling et al. | | 257/138 |
| 5,767,546 A * | 6/1998 | Williams et al. | | 257/343 |
| 6,365,932 B1 * | 4/2002 | Kouno et al. | | 257/341 |
| 6,830,725 B2 | 12/2004 | Fetcenko et al. | | |
| 6,831,331 B2 * | 12/2004 | Kitamura et al. | | 257/343 |
| 6,936,975 B2 | 8/2005 | Lin et al. | | |
| 6,995,428 B2 | 2/2006 | Huang et al. | | |
| 7,095,632 B2 | 8/2006 | Fukumoto | | |
| 7,335,543 B2 | 2/2008 | Chen et al. | | |
| 2002/0017697 A1 | 2/2002 | Kitamura et al. | | |
| 2003/0127689 A1 * | 7/2003 | Hebert | | 257/336 |
| 2004/0051133 A1 * | 3/2004 | Sugita et al. | | 257/315 |
| 2004/0119116 A1 * | 6/2004 | Byeon et al. | | 257/335 |
| 2005/0205926 A1 | 9/2005 | Chen et al. | | |
| 2006/0011985 A1 * | 1/2006 | Cai et al. | | 257/369 |
| 2006/0055065 A1 | 3/2006 | Liu et al. | | |

FOREIGN PATENT DOCUMENTS

| | | |
|---|---|---|
| CN | 1538793 A | 10/2004 |
| CN | 1661812 A | 8/2005 |
| CN | 1716550 A | 1/2006 |
| TW | 093108783 | 3/2005 |
| TW | I238593 B | 8/2005 |
| TW | I253801 B | 4/2006 |
| TW | 094130923 | 8/2006 |

* cited by examiner

*Primary Examiner* — Steven J Fulk

(57) ABSTRACT

A cellular transistor includes an N-type heavily doped (N+) buried layer (NBL), an N-well connected to the NBL, an N+ layer connected to the N-well and multiple drains. The N-well is formed after formation of the NBL. The N+ layer is formed after formation of the N-well. The multiple drains are connected to the NBL via the N-well and the N+ layer.

25 Claims, 12 Drawing Sheets

POWER MOSFET INTEGRATION

RELATED APPLICATION

This application is a continuation-in-part application of U.S. application Ser. No. 11/903,879, titled "Power MOSFET Integration", filed on Sep. 25, 2007, and claims priority to U.S. provisional application, titled "Power MOSFET Integration", Ser. No. 61/194,587, filed on Sep. 29, 2008, which are hereby incorporated by reference in their entirety.

BACKGROUND

During the past few decades, there has been an increasing interest in power metal oxide semiconductor field effective transistor (MOSFET) technologies for use in high-voltage (HV) applications that require power devices.

In conventional HV applications, a power MOSFET which functions as a switch is typically manufactured externally to an integrated circuit of a controller (e.g., an inverter controller) which controls ON/OFF of the power MOSFET, because several obstacles exist in the integration technology of the power MOSFET and the controller circuitry. For example, integrating the power MOSFET and the controller on a same chip will cause large die size and thus increasing the cost.

SUMMARY

In one embodiment, a cellular transistor includes an N-type heavily doped (N+) buried layer (NBL), an N-well connected to the NBL, an N+ layer connected to the N-well and multiple drains. The N-well is formed after formation of the NBL. The N+ layer is formed after formation of the N-well. The multiple drains are connected to the NBL via the N-well and the N+ layer.

BRIEF DESCRIPTION OF THE DRAWINGS

Features and advantages of embodiments of the claimed subject matter will become apparent as the following detailed description proceeds, and upon reference to the drawings, wherein like numerals depict like parts, and in which:

DETAILED DESCRIPTION

In the following detailed description of the present invention, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Some portions of the detailed descriptions that follow are presented in terms of procedures, logic blocks, processing, and other symbolic representations of operations for fabricating semiconductor devices. These descriptions and representations are the means used by those skilled in the art of semiconductor device fabrication to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "forming," "performing," "producing," "depositing," "etching," "fabricating," "connecting," "implanting," "integrating" or the like, refer to actions and processes of semiconductor device fabrication.

It is understood that the figures are not drawn to scale, and only portions of the structures depicted, as well as the various layers that form those structures, are shown.

Furthermore, other fabrication processes and steps may be performed along with the processes and steps discussed herein; that is, there may be a number of process steps before, in between and/or after the steps shown and described herein. Importantly, embodiments of the present invention can be implemented in conjunction with these other processes and steps without significantly perturbing them. Generally speaking, the various embodiments of the present invention can replace portions of a conventional process without significantly affecting peripheral processes and steps.

Figure 1:
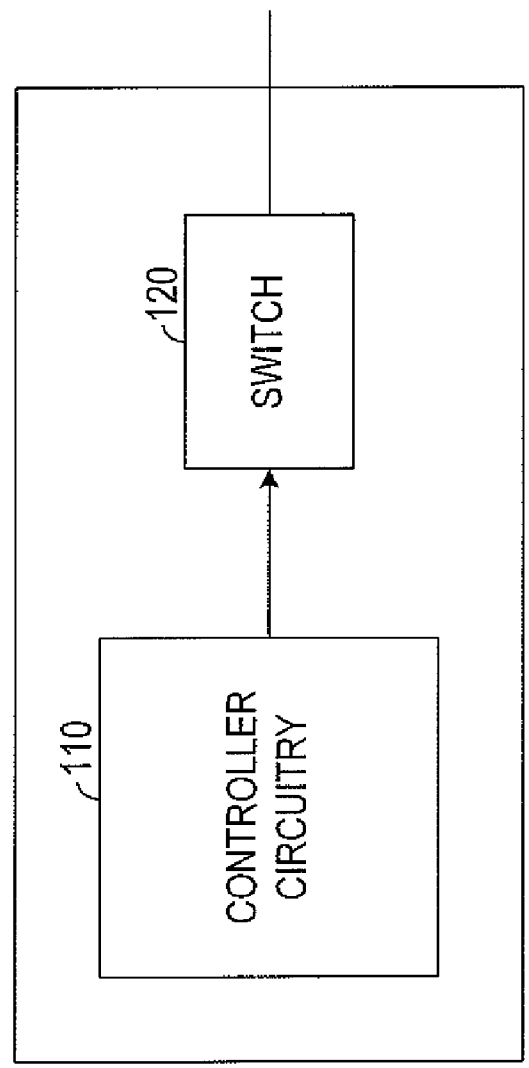
FIG. 1 illustrates a block diagram of an integrated circuit, in accordance with one embodiment of the present invention.

FIG. 1 illustrates a block diagram of an integrated circuit (IC) 100, in accordance with one embodiment of the present invention. Applications for the IC 100 can include, but are not limited to, high voltage (HV) electronic circuits (e.g., the operating voltage is higher than 5V), such as CCLF inverter, LED lighting, battery charger, DC/DC converter, backlight inverter, battery charger controller, etc., that require one or more power semiconductor devices. The IC 100 can include a switch (e.g., current switch or voltage switch) 120 and a controller circuitry 110 for controlling the switch 120.

Advantageously, the switch 120 and the controller circuitry 110 are integrated on a single chip, in one embodiment. The switch 120 can be a power metal oxide semiconductor field effective transistor (MOSFET).

In one embodiment, the IC 100 including the controller circuitry 110 and the switch 120 can be manufactured by metal oxide semiconductor (MOS) technology. In one embodiment, the controller circuitry 110 includes one or more MOS transistors. In one embodiment, the MOS transistor(s) in the controller circuitry 110 can be manufactured as, but are not limited to, lateral diffused metal oxide semiconductor (LDMOS) transistor(s). The switch 120 can be manufactured as, but is not limited to, a cellular double diffused drain metal oxide semiconductor (DDDMOS) transistor.

In one embodiment, the controller circuitry 110 includes one or more LDMOS transistors. Advantageously, by using LDMOS transistors in the controller circuitry 110, the controller circuitry 110 can have an enhanced reliability compared to a controller circuitry using other types of transistors, e.g., DDDMOS transistors, in one embodiment. LDMOS transistors can operate when an operating voltage is high (e.g., 30V-40V), hence the controller circuitry 110 using LDMOS transistors can demonstrate an enhanced reliability. For example, the controller circuitry 110 using LDMOS transistors is able to possess sufficient tolerance towards undesired electrical/voltage stress conditions, e.g., in a hot carrier injection (HCI) test.

Furthermore, by using the cellular DDDMOS transistor as the switch 120, the switch 120 can have a smaller size and a faster response compared to other types of transistor, e.g., an LDMOS transistor. In one embodiment, the drain of the switch (e.g., power MOSFET) 120 is selectively coupled to a maximum operating voltage or a lower voltage. More specifically, the drain voltage can drop to the lower voltage, e.g., to 0.5V when the switch (the cellular DDDMOS transistor) 120 is turned on and the drain voltage can restore to the maximum operating voltage (which can vary according to different applications) when the switch (the cellular DDDMOS transistor) 120 is turned off. In addition, the turn-on period (e.g., conduction period) of the switch 120 is relatively small under the control of the controller circuitry 110, in one embodiment. Hence, an HCI effect will not be induced in such operation and the switch (the cellular DDDMOS transistor) 120 can survive in a HV condition.

As a result, the IC 100 includes a switch 120 which is a cellular DDDMOS transistor, and a controller circuitry 110 which controls the switch 120 and includes one or more LDMOS transistors. Advantageously, the IC 100 is featured with an enhanced reliability and a smaller die size. In one embodiment, the co-existing of the LDMOS transistor(s) and the cellular DDDMOS transistor on a single chip can be achieved according to a fabrication process shown in FIG. 2. Using the fabrication process shown in FIG. 2, a punch-through capability of the cellular DDDMOS transistor can be enhanced by adding an N-type grade (NGRD) implant in the process. Consequently, the IC 100 including LDMOS and DDDMOS transistors can further enhance the reliability in high voltage applications.

Figure 2:
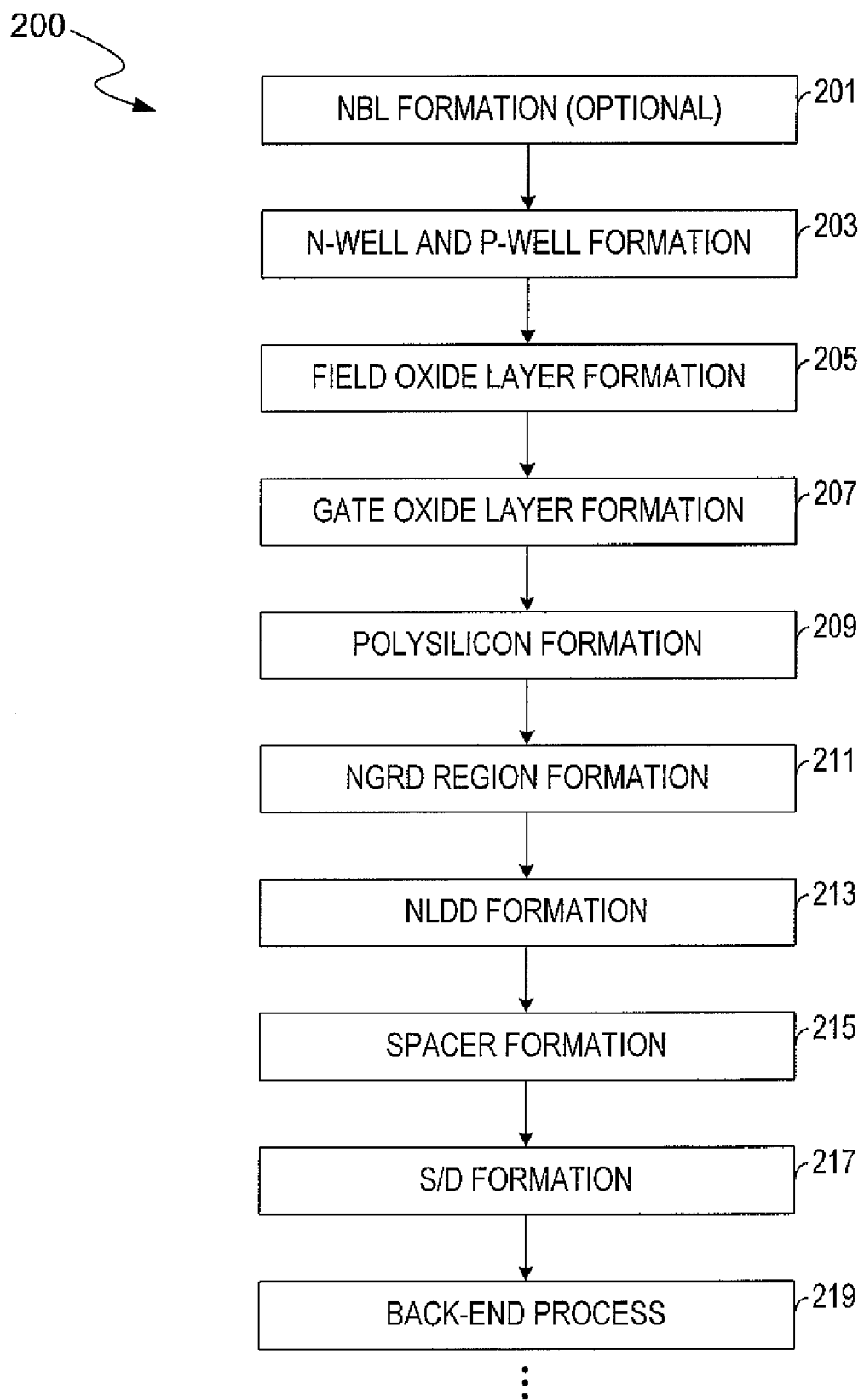
FIG. 2 illustrates a flowchart of a process for fabricating a switch and a controller circuitry on a single chip, in accordance with one embodiment of the present invention.

FIG. 2 illustrates a flowchart 200 of a process for fabricating a switch and a controller circuitry on a single chip, in accordance with one embodiment of the present invention. The flowchart 200 is described herein in combination with Table 1.

TABLE 1

| Step | Process |
|---|---|
| 1 | @ Wafer start |
| 2 | @ NBL mask |
| 3 | @ NBL implant |
| 4 | @ Drive in |
| 5 | @ P-epi deposition |
| 6 | @ N-well mask |
| 7 | @ N-well implant |
| 8 | @ Well oxide (drive-in) |
| 9 | @ P-well implant |
| 10 | @ OD mask |
| 11 | @ SiN etch |
| 12 | @ P-field mask |
| 13 | @ P-field implant |
| 14 | @ Field oxide |
| 15 | @ Gate oxide |
| 16 | @ HV gate oxide2 mask |
| 17 | @ Wet etch |
| 18 | @ Gate oxide |
| 19 | @ Vt implant |
| 20 | @ Poly deposition |
| 21 | @ N+ poly dope |
| 22 | @ Poly mask |
| 23 | @ Poly etch |
| 24 | @ NGRD mask |
| 25 | @ NGRD implant |
| 26 | @ NLDD mask |
| 27 | @ NLDD implant |
| 28 | @ TEOS deposition |
| 29 | @ Spacer dry etch |
| 30 | @ N+ mask |
| 31 | @ N+ S/D implant |
| 32 | @ P+ mask |
| 33 | @ P+ S/D implant |
| 34 | @ BPSG deposition |
| 35 | @ BPSG flow |
| 36 | @ Contact mask |
| 37 | @ Contact etch |
| 38 | @ Back-end metallization |
| 39 | @ Etc. |

At step 1, a wafer is made. Subsequently, different photoresists are deposited on a semiconductor substrate and then selectively patterned by the exposure and developing process. At step 2, a first photoresist is deposited as an N-type heavily doped buried layer (NBL) mask. At steps 3-4, an N-type heavily doped (N+) impurity ion is implanted into selected wafer region by the patterned NBL mask and is implanted with a certain depth. At step 5, P-epi deposition is performed to form a P-type epitaxy (P-epi) layer. Hence, in block 201, an NBL formation is implemented according to steps 1-5. The NBL formation can be optional in some HV applications.

The first photoresist is then removed from the wafer surface. At step 6, a second photoresist is deposited as an N-well mask. At steps 7-8, N-well is implanted using the patterned N-well mask and is implanted with a certain depth. Similarly, P-well implant is implemented at step 9. Hence, in block 203, an N-well formation is implemented in steps 6-8 and a P-well formation is implemented in step 9.

The second photoresist is then removed. At step 10, a third photoresist is deposited as an OD mask to define active areas. The third photoresist is then selectively etched by silicon nitride (SiN), e.g., SiN etching at step 11. After a removal of the third photoresist, a fourth photoresist is deposited as a P-field mask at step 12. After P-field is implanted at step 13, field oxidation is implemented at step 14. Hence, in block 205, field oxide layers/regions are formed according to steps 10-14.

Afterwards, gate oxidation is implemented at step 15. After a removal of the fourth photoresist, a fifth photoresist is deposited as a HV gate oxidation mask at step 16. At step 17, wet etching is performed. Then a second gate oxidation is implemented at step 18. As such, in block 207, a gate oxide layer is formed according to steps 15-18.

The fifth photoresist is then removed. At step 19, Vt implantation is implemented for regulating a threshold voltage value of MOS transistor(s). The polysilicon is doped at step 20. After a development of a sixth photoresist as a poly mask at step 22, polysilicon etching is performed at step 23. As such, in block 209, a polysilicon formation is completed according to steps 19-23.

After a removal of the sixth photoresist, a seventh photoresist is deposited as an NGRD (N-type grade) mask at step 24. After the NGRD mask deposition, the NGRD implantation is implemented at step 25. In one embodiment, the NGRD photoresist mask can be omitted in order to form an NGRD layer. Instead, only performing a blank implant of NGRD can also achieve the desired device characteristics of a cellular DDDMOS transistor without affecting all other device characteristics if properly design the devices (e.g., the single chip 100), in one embodiment. In one embodiment, the NGRD implantation is implemented at an implant dose approximately between 1.0E12 and 9.0E13 atoms/cm2. The dose can vary, but within a range such that the density of the NGRD layer is less than that of an N+ layer formed in step 31 and a depth of the NGRD) layer is slightly greater than that of the N+ layer formed in step 31. As a result, in block 211, an NGRD region (e.g., NGRD layer) is formed according to steps 24-25.

After a removal of the seventh photoresist, an eighth photoresist is deposited as an NLDD (N-type lateral double drain) mask at step 26. At step 27, NLDD implantation is implemented using the patterned NLDD mask. As a result, in block 213, an NLDD formation is implemented according to steps 26-27.

After the tetraethylorthosiliate (TEOS) deposition at step 28, spacer dry etching is performed at step 29. Hence, in block 215, a spacer formation is implemented according to steps 28-29.

After a removal of the eighth photoresist, a ninth photoresist is deposited as an N+ mask at step 30. Subsequently, an N+ source/drain (S/D) implantation is implemented at step 31. Similarly, a P-type heavily doped (P+) mask is used at step 32 and a P+ S/D implantation is implemented at step 33. Hence, in block 217, an S/D formation is implemented according to steps 30-33.

After BPSG deposition at step 34, boron phosphorus silicate glass (BPSG) flow is implemented at step 35 to smooth the surface of the aforementioned layers and/or regions. At steps 36-37, a mask is used and then an etching is performed to form different contacts. At step 38, a back-end metallization is implemented. Hence, in block 219, a back-end process is performed according to steps 34-38.

Therefore, in one embodiment, the co-existing of the LDMOS transistors and the cellular DDDMOS transistor in the IC 100 is achieved by adding an NGRD implant in the process. In one embodiment, the NGRD implant can be added after the polysilicon formation and prior to spacer formation. In an alternative embodiment, the spacer formation (block 215, steps 28-29) can be implemented prior to the NGRD mask and implantation procedures (block 211, steps 24-25). The process shown in Table 1 is for illustrative purposes and is not intended to be limited to such specific process.

Figure 3:
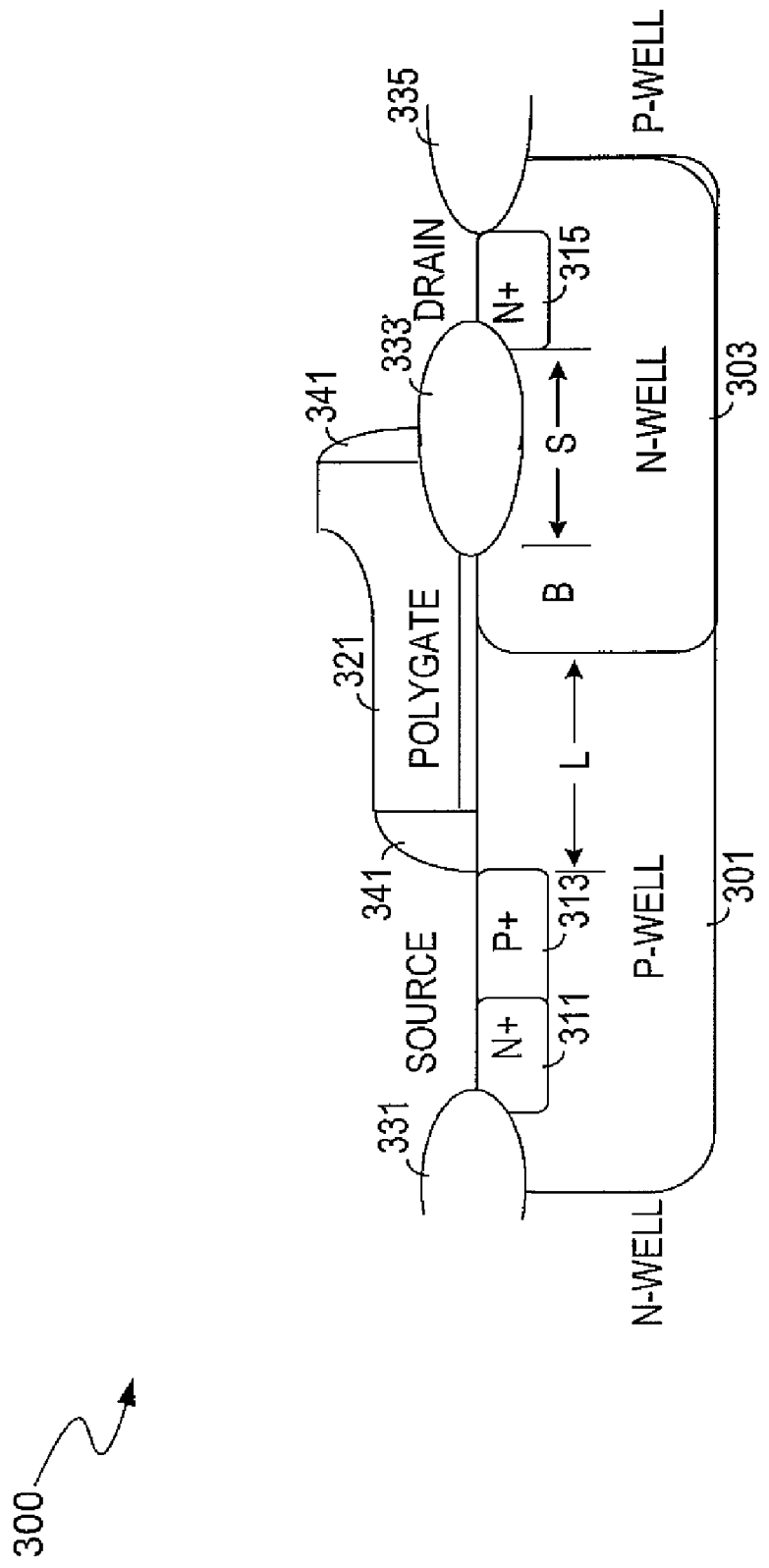
FIG. 3 illustrates a structure diagram of a lateral diffused metal oxide semiconductor (LDMOS) transistor, in accordance with one embodiment of the present invention.

FIG. 3 illustrates a structure diagram of a MOS transistor having a laterally diffused (LD) structure, e.g., a LDMOS transistor 300, in accordance with one embodiment of the present invention. The LDMOS transistor 300 is fabricated according to the manufacturing process shown in FIG. 2 and/or Table 1, and can be employed as a HV transistor in the controller circuitry 110 in FIG. 1. In one embodiment, the LDMOS transistor 300 can include a P-type well (P-well) 301, an N-type well (N-well) 303, an N-type heavily doped (N+) layer/region 311, a P-type heavily doped (P+) layer/region 313, an N+ layer/region 315, and a polygate 321. The polygate 321 can have a spacer 341. The LDMOS transistor 300 can further include field oxide layers/regions 331, 333 and 335.

In one embodiment, the N-well 303 is formed in steps 6-8. The P-well 301 can be formed in step 9. The filed oxide layers/regions 331, 333 and 335 can be formed in steps 10-14. The polygate 321 can be formed in steps 15-23. The spacer 341 can be formed in steps 28-29. The N+ layers 311 and 315 can be formed in step 31. The P+ layer 313 can be formed in steps 32-33.

In one embodiment, the P-well 301 is adjacent to the N-well 303. The N+ layer 311 is adjacent to the P+ layer 313. The N+ layer 311 and the P+ layer 313 are formed within the P-well 301 at a predetermined depth to constitute a source region. The N+ layer 315 is formed within the N-well 303 at a predetermined depth to constitute a drain region. The polygate 321 is formed on the P-well 301 and the N-well 303 to constitute a gate region. Advantageously, the LDMOS transistor 300 demonstrates an enhanced reliability and is able to possess sufficient tolerance towards undesired electrical/voltage stress conditions, in one embodiment.

Figure 4:
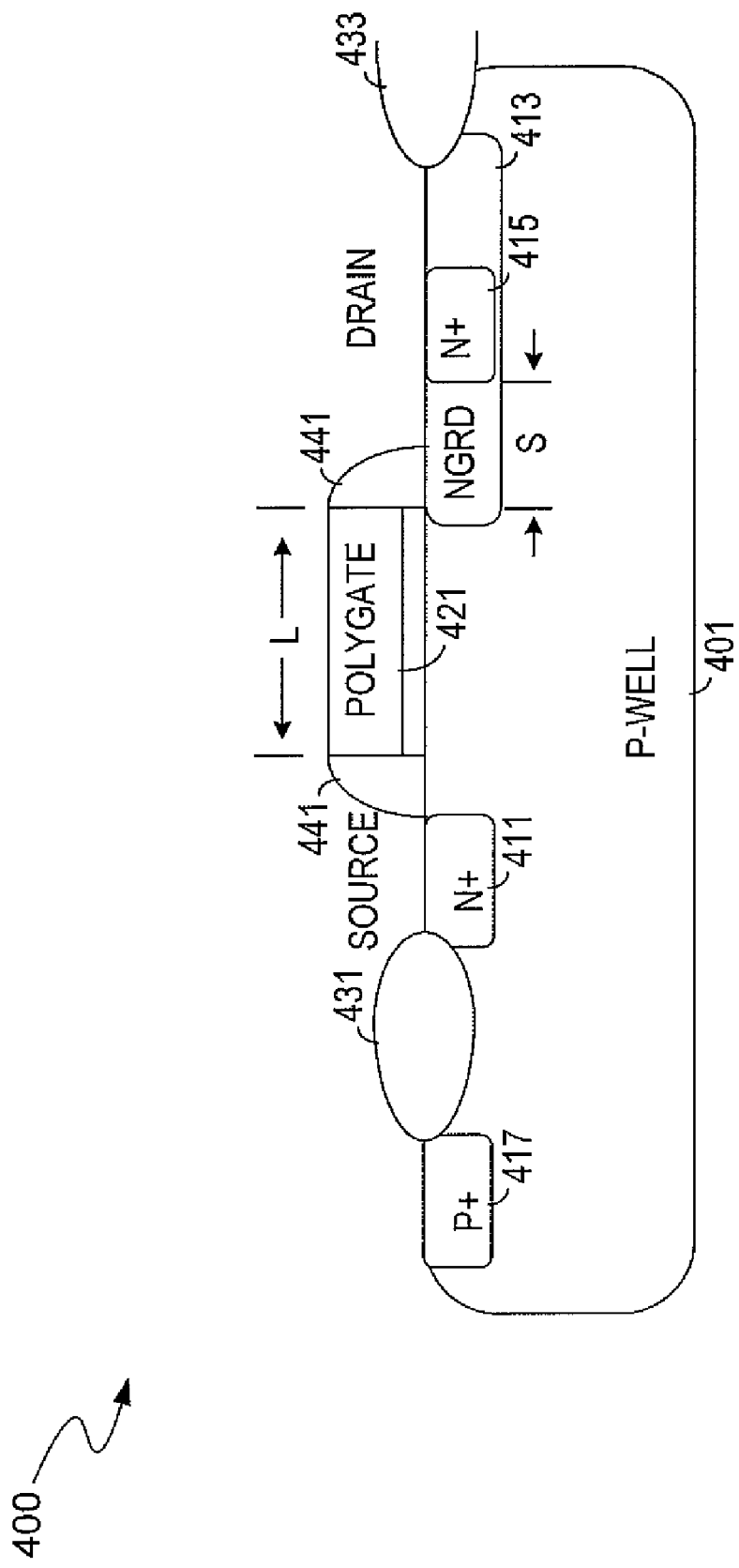
FIG. 4 illustrates a structure diagram of an asymmetric double diffused drain metal oxide semiconductor (DDDMOS) transistor, in accordance with one embodiment of the present invention.

FIG. 4 illustrates a structure diagram of a MOS transistor having a double diffused drain (DDD) structure, e.g., an asymmetric DDDMOS transistor 400, in accordance with one embodiment of the present invention. The DDDMOS transistor 400 is fabricated according to the manufacturing process in FIG. 2 and/or Table 1, and the power MOSFET (e.g., a current switch or voltage switch) 120 in FIG. 1 can employ the structure of the DDDMOS transistor 400. The DDDMOS transistor 400 is featured by a higher breakdown voltage and hence the high voltage endurance capability of the DDDMOS transistor 400 is enhanced. In one embodiment, the DDDMOS transistor 400 can include a P-well 401, an N+ layer/region 411, an N-type grade (NGRD) layer/region 413, an N+ layer/region 415, a P+ layer/region 417, and a polygate 421. The polygate 421 can have a spacer 441. The DDDMOS transistor 400 can further include field oxide layers/regions 431 and 433.

Elements in FIG. 4 that are labeled similar as in FIG. 3 can be formed in similar steps in Table 1/FIG. 2 as described in relation to FIG. 2, and will not be detailed described herein. In addition, the NGRD layer 413 can be formed by steps 24-25.

In one embodiment, the NGRD layer 413 is formed between the polygate 421 and the N+ layer 415. Since the NGRD layer 413 surrounds the N+ layer 415, of which a depth is less than that of the NGRD layer 413, the punch-through capability of the DDDMOS transistor 400 can be enhanced. In addition, the distance between the polygate 421 and the N+ layer 415 will decrease the electronic field intensity, thus also improving a punch-through capability of the DDDMOS transistor 400. As a result, a breakdown voltage (e.g., between drain and source) of the DDDMOS transistor 400 can be enhanced.

In one embodiment, the N+ layer 411, the NGRD layer 413 and the P+ layer 417 are formed within the P-well 401. The N+ layer 415 is formed within the NGRD layer 413 that can be formed by phosphorus, or arsenic, etc., in one embodiment. The N+ layer 415 is surrounded by the NGRD layer 413. A density of the N+ layer 415 is greater than that of the NGRD layer 413, in one embodiment. The N+ layer 411 constitutes a source region of the DDDMOS transistor 400.

The NGRD layer 413 and the N+ layer 415 constitute a drain region of the DDDMOS transistor 400. The polygate 421 is formed on the P-well 401 and a predetermined region of the NGRD layer 413 to constitute a gate region of the DDDMOS transistor 400. Advantageously, the DDDMOS transistor 400 has a smaller size and a faster response, in one embodiment. In addition, by combining the NGRD layer 413 with the N+ layer 415 in the drain region, the punch-through breakdown characteristics of the DDDMOS transistor can be improved.

Accordingly, in one embodiment, a method for integrating a switch (e.g., power MOSFET) 120 and a controller circuitry 110 for controlling the switch are provided. In one embodiment, the method includes forming an NGRD layer 413 at an implant dose that is approximately between 1.0E12 and 9.0E13 atoms/cm2, and fabricating multiple transistors from the controller circuitry 110 and the switch 120 on a single chip. The multiple transistors in the controller circuitry 110 and the switch 120 can be high voltage transistors. The method further includes forming a spacer 441 after formation of the NGRD layer 413 or prior to formation of the NGRD layer 413. The method further includes forming an N-type heavily doped (N+) layer 415 surrounded by the NGRD layer 413. The depth of the N+ layer 415 is slightly less than that of the NGRD layer 413, in one embodiment. The density of the N+ layer 415 is greater than that of the NGRD layer 413, in one embodiment. The multiple transistors in the controller circuitry 110 can be, but is not limited to, lateral diffused metal oxide semiconductor (LDMOS) transistors. The switch 120 can be, but is not limited to, a cellular double diffused drain metal oxide semiconductor (DDDMOS) transistor.

In one embodiment, a single integrated circuit 100 includes a switch 120 including an N-type grade (NGRD) layer 413, and a controller circuitry 110 for controlling the switch 120. The switch 120 further includes an N-type heavily doped (N+) layer 415, and the NGRD layer 413 surrounding the N+ layer 415. The NGRD layer 415 and the N+ layer 413 constitute a drain region of the switch 120. Advantageously, the fabrication technology in accordance with one embodiment of the present invention can integrate a switch 120 and a controller circuitry 110 on a single chip with reduced die size, enhanced reliability endurance in high voltage (HV) applications, and less cost.

Advantageously, The IC 100 has an enhanced reliability and a smaller die size by using multiple LDMOS transistors in the controller circuitry 110 and a cellular DDDMOS transistor (e.g., DDDMOS transistor 400) as the switch 120. Other types of transistors within the sprit and scope of the invention can also be used in the controller circuitry 110 and the switch 120. The IC 100 further enhances its reliability by an implantation of the NGRD layer 413 in the DDDMOS transistor 400, which results in an improvement of a punch-through capability of the DDDMOS transistor 400.

Figure 5:
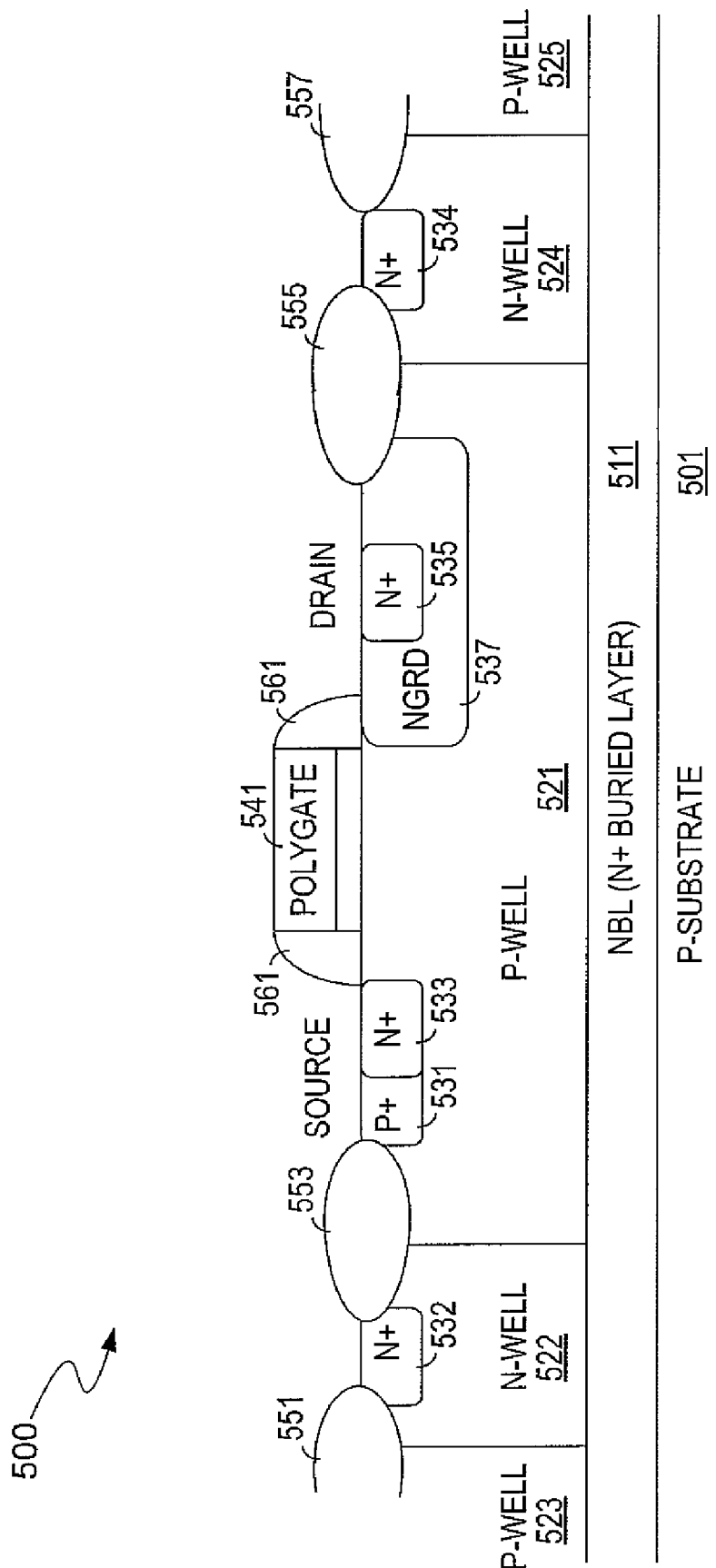
FIG. 5 illustrates a structure diagram of a DDDMOS transistor, in accordance with one embodiment of the present invention.

FIG. 5 illustrates a structure diagram of a MOS transistor having a DDD structure, e.g., an asymmetric DDDMOS transistor 500, in accordance with one embodiment of the present invention. The DDDMOS transistor 500 is fabricated according to the manufacturing process in FIG. 2 and/or Table 1, and the power MOSFET (e.g., a current switch or voltage switch) 120 in FIG. 1 can employ the structure of the DDDMOS transistor 500. The DDDMOS transistor 500 can have a higher breakdown voltage and hence the high voltage endurance capability of the DDDMOS transistor 500 can be enhanced. In one embodiment, the DDDMOS transistor 500 can include a P-substrate 501, an N+ buried layer (NBL) 511, P-wells 521, 523 and 525, N-wells 522 and 524, a P+ layer/region 531, N+ layers/regions 532, 533, 534 and 535, an NGRD layer 537, and a polygate 541. The polygate 541 can have a spacer 561. The DDDMOS transistor 500 can further include field oxide layers/regions 551, 553, 555 and 557.

In one embodiment, the NGRD layer 537 is formed between the polygate 541 and the N+ layer 535. Since the N+ layer 535 is surrounded by the NGRD layer 537, the punch-through capability of the DDDMOS transistor 500 can be enhanced. In addition, the distance between the polygate 541 and the N+ layer 535 can reduce the electronic field intensity, thus further improving the punch-through capability of the DDDMOS transistor 500. Hence, a breakdown voltage (e.g., between drain and source) of the DDDMOS transistor 500 can be increased.

Elements in FIG. 5 that are labeled similarly as those in FIG. 3/FIG. 4 are formed by similar steps in Table 1/FIG. 2 as discussed in FIG. 3/FIG. 4, and will not be detailed described herein for clarity. In addition, the NBL 511 can be formed by steps 2-5 in Table 1. In one embodiment, the NBL 511 can isolate the P-wells 523 and 525 from the P-substrate 501. Hence, the P-well 523 or 525 can have a potential different from the P-substrate 501. The P+ layer 531, the N+ layers 533 and 535, and the NGRD layer 537 are formed within the P-well 521. A density of the N+ layer 535 is greater than that of the NGRD layer 537 and a depth of the N+ layer 535 is less than that of the NGRD layer 537, in one embodiment. The P+ layer 531 and the N+ layer 533 constitute a source region of the DDDMOS transistor 500. The polygate 541 is formed on the P-well 521 and a predetermined region of the NGRD layer 537 to constitute a gate region of the DDDMOS transistor 500. The N+ layer 535 and the NGRD layer 537 constitute a drain region of the DDDMOS transistor 500. Advantageously, the DDDMOS transistor 500 has a smaller size and a faster response, in one embodiment. Additionally, by combining the NGRD layer 537 with the N+ layer 535 in the drain region, the punch-through breakdown characteristics of the DDDMOS transistor 500 can be improved.

Figure 6:
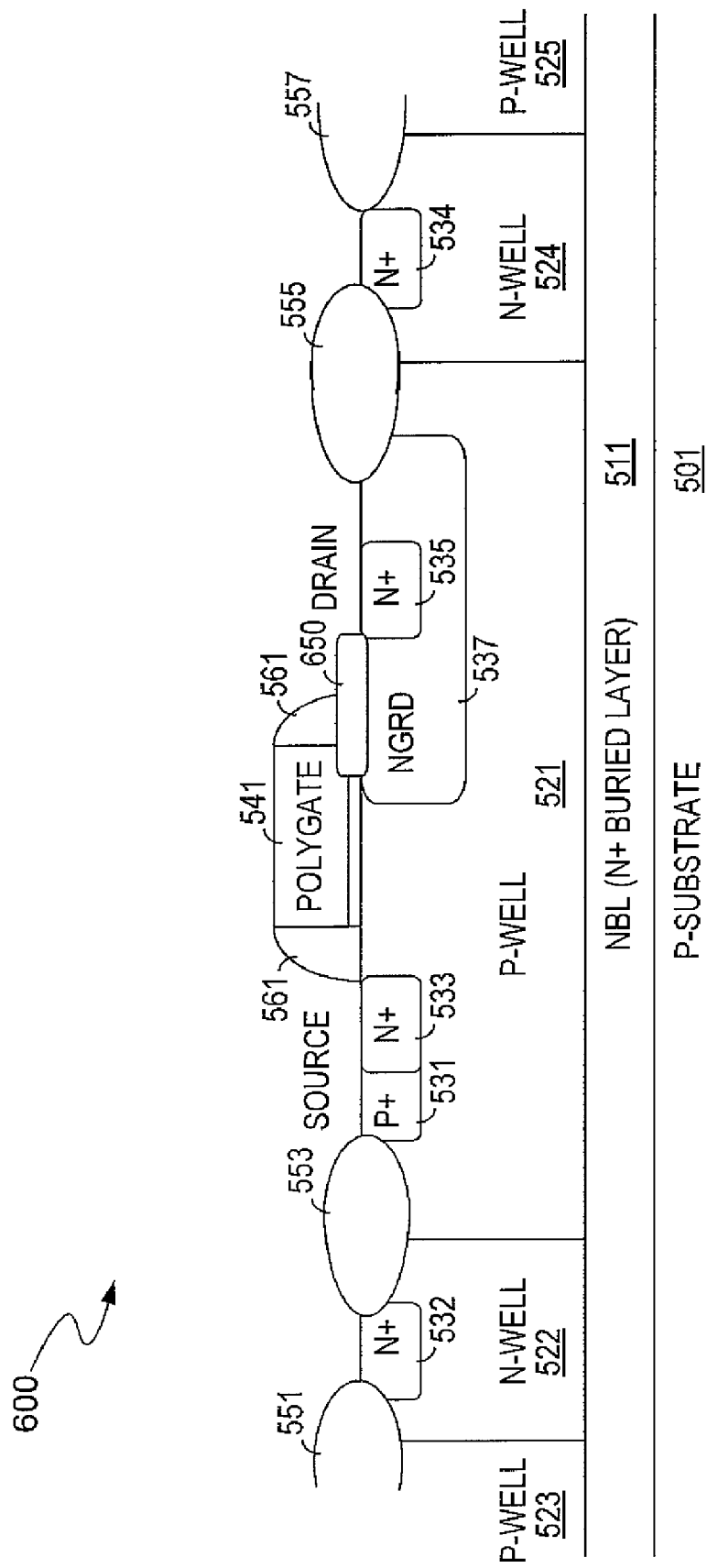
FIG. 6 illustrates a structure diagram of a DDDMOS transistor, in accordance with one embodiment of the present invention.

FIG. 6 illustrates a structure diagram of a MOS transistor having a DDD structure, e.g., an asymmetric DDDMOS transistor 600, in accordance with one embodiment of the present invention. Elements in FIG. 6 that are labeled the same as in FIG. 5 have similar functions and will not be detailed described herein.

In one embodiment, the DDDMOS transistor 600 can include a field oxide layer/region 650 that is formed between the polygate 541 and the NGRD layer 537. The field oxide layer 650 is adjacent to the N+ layer 535. Advantageously, the implantation of the field oxide layer 650 can further improve the breakdown voltage of a HV transistor (e.g., the DDDMOS transistor 600) and hence the high voltage endurance capability of the DDDMOS transistor 600 can be further enhanced. In one embodiment the fabricating process flow for the DDDMOS transistor 600 can be slightly different from Table 1. The NGRD implant steps (e.g., steps 24-25) can be performed prior to field oxide formation (e.g., steps 10-14). Hence, the NGRD layer 537 can be formed right underneath the field oxide layer(s) 650 while the field oxide layers 551, 553, 555, 557 and 650 can be formed simultaneously in steps 10-14. In one embodiment, the NGRD implant steps can be performed before or after the field oxide formation, but a separated oxide layer, e.g., 650 (can be thicker or thinner) can be grown right after the NGRD implant steps, where the NGRD layer, e.g., 537 is formed right underneath this separated grown oxide layer.

Figure 7:
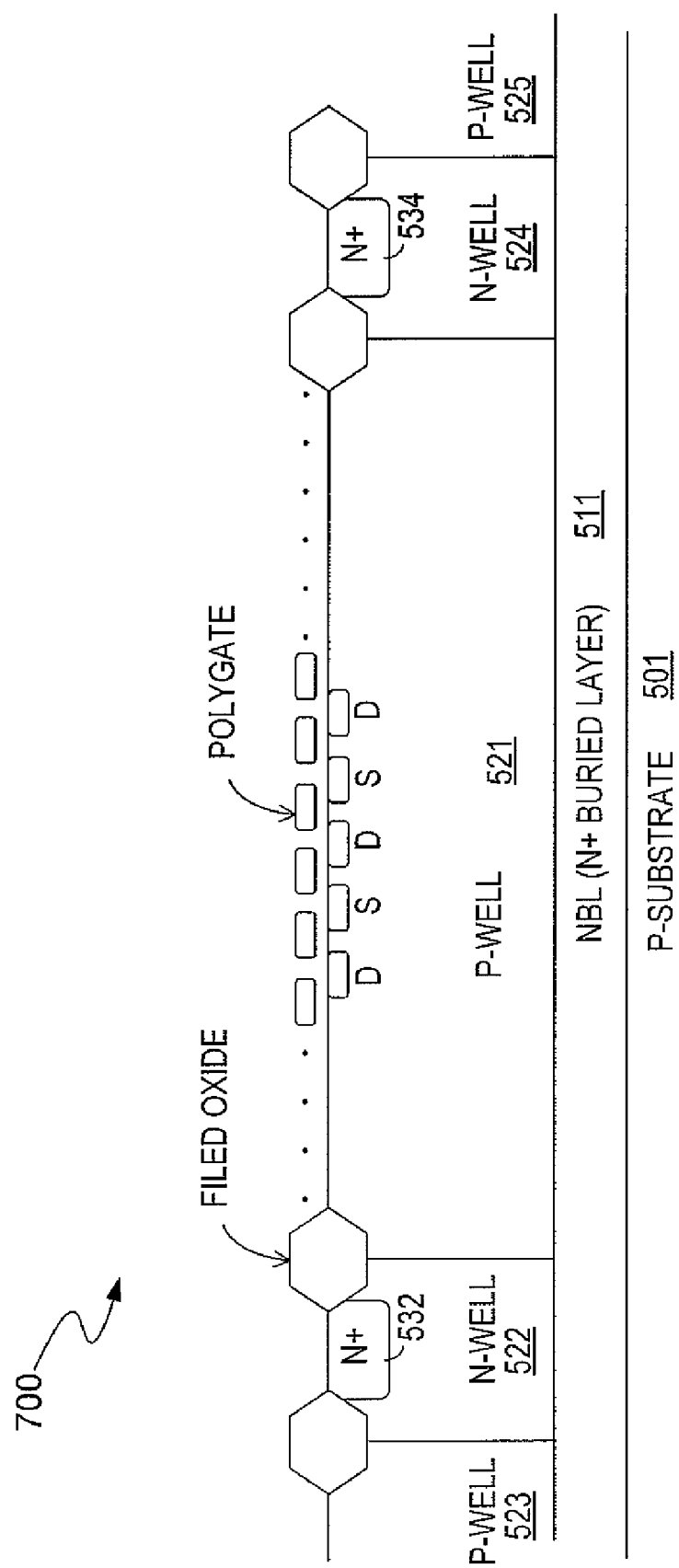
FIG. 7 illustrates a section view of a structure diagram of a cellular DDDMOS transistor, in accordance with one embodiment of the present invention.

Turning to FIG. 7, a section view of a structure diagram of a cellular transistor, e.g., a cellular DDDMOS transistor 700 is illustrated, in accordance with one embodiment of the present invention. Elements in FIG. 7 that are labeled the same as those in FIG. 5/FIG. 6 are formed by similar steps in Table 1/FIG. 2 as discussed in relation to FIG. 5/FIG. 6.

The cellular DDDMOS transistor 700 can be fabricated according to the manufacturing process described in Table 1, FIG. 2 and/or FIGS. 4-6. Compared with the DDDMOS transistor 500/600, multiple gates are fabricated by steps 15-18 in Table 1 and multiple drains and sources are fabricated by steps 30-33 in Table 1 for the cellular DDDMOS transistor 700.

Figure 7A:
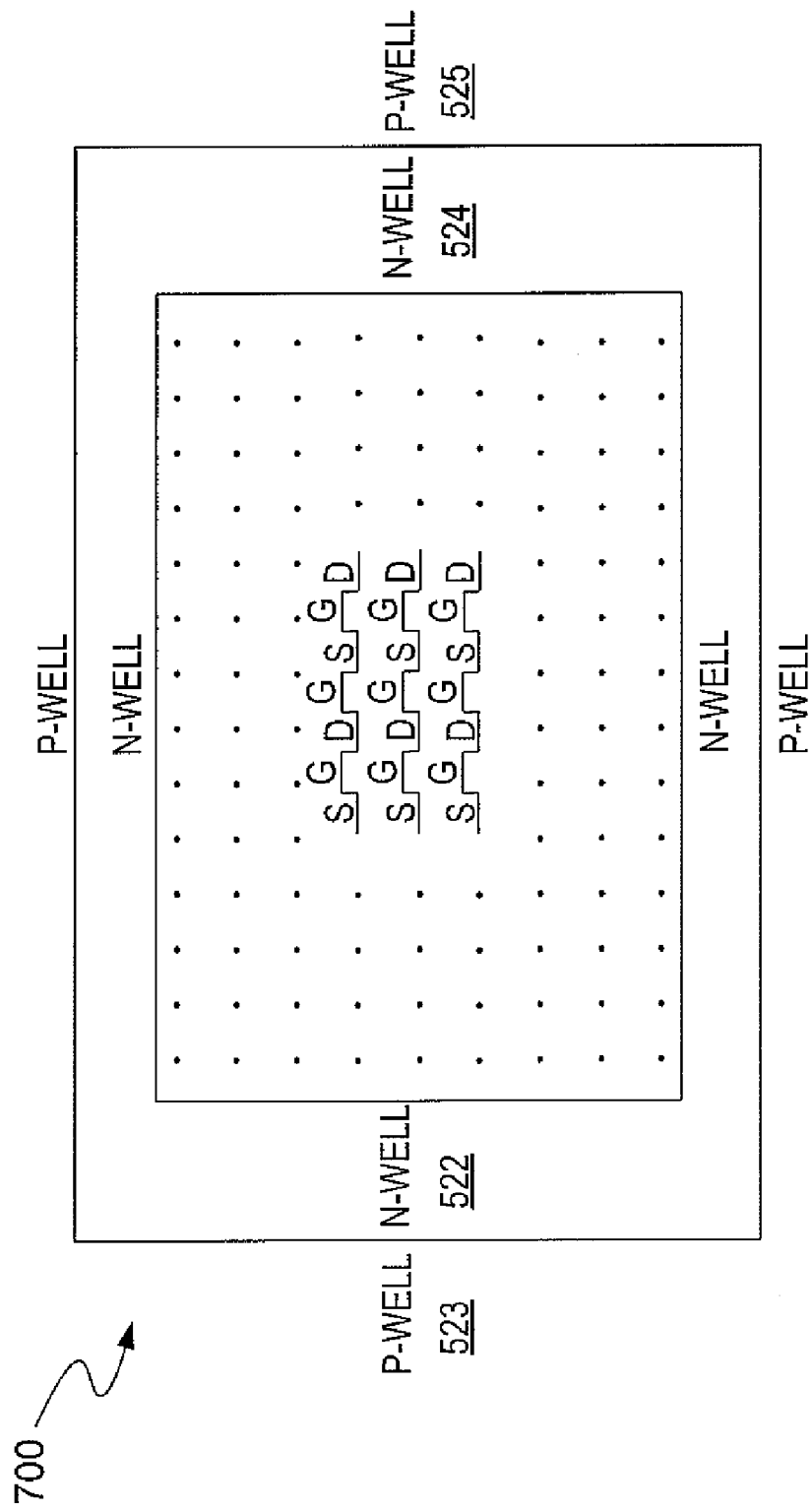
FIG. 7A illustrates a top view of a structure diagram of a cellular DDDMOS transistor, in accordance with one embodiment of the present invention.

FIG. 7A illustrates a top view of a structure diagram of a cellular DDDMOS transistor, e.g., the cellular DDDMOS transistor 700, in accordance with one embodiment of the present invention. Elements in FIG. 7A that are labeled the same as those in FIG. 7 are formed by similar steps in Table 1/FIG. 2 as discussed in relation to FIG. 7. The N-well 522 can be the same as the N-well 524, both of which are formed by steps 6-8 in Table 1. Similarly, the P-well 523 can be the same as the P-well 525, both of which are formed by step 9 in Table 1.

Figure 8:
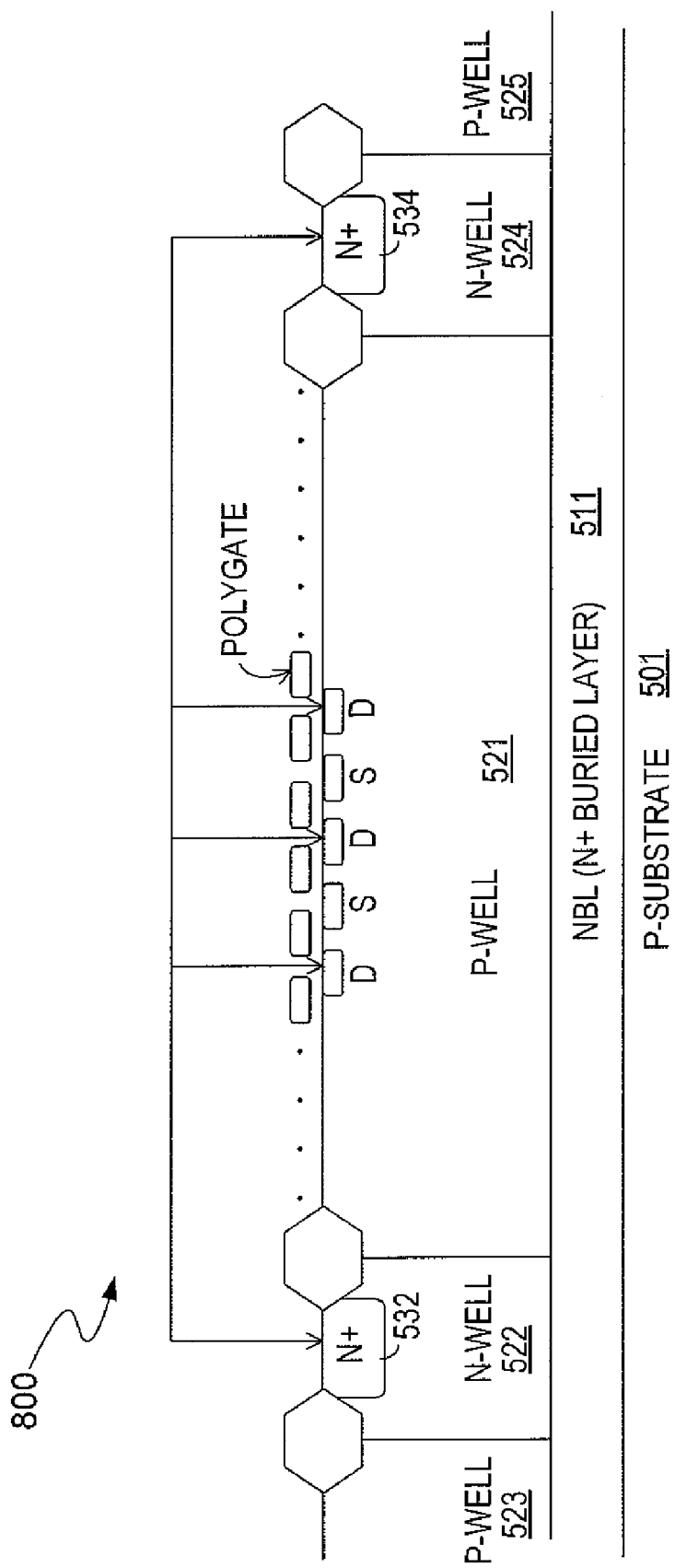
FIG. 8 illustrates a structure diagram of a cellular DDDMOS transistor, in accordance with one embodiment of the present invention.

FIG. 8 illustrates a structure diagram of a cellular transistor, e.g., a cellular DDDMOS transistor 800, in accordance with one embodiment of the present invention. FIG. 8 is described in combination of FIGS. 5-7. The cellular DDDMOS transistor 800 can be fabricated by the manufacturing process shown in Table 1, FIG. 2 and/or FIGS. 4-7.

In one embodiment, the N-well 522/524 is connected to the NBL 511 and formed after the formation of the NBL 511. The N+ layer 532/534 is connected to the N-well 522/524 and formed after the formation of the N-well 522/524. The cellular DDDMOS transistor 800 can include multiple gates fabricated by steps 15-18 in Table 1 and multiple drains and sources fabricated by steps 30-33 in Table 1.

In one embodiment, all the drains of the cellular DDDMOS transistor 800 are connected to the N-wells 522 and 524 via the N+ layers 532 and 534 respectively. Therefore, all the drains of the cellular DDDMOS transistor 800 are connected to the NBL 511 via the N+ layer 532/534 and the N-well 522/524. As a result, the voltage level of all the drains of the cellular DDDMOS transistor 800 can be substantially the same with that of the NBL 511. There can be different ways to connect the drains of the cellular DDDMOS transistor to the NBL 511, without departing from the spirit and scope of the present invention. For example, an external wire can be used to connect all the drains of the cellular DDDMOS transistor 800 to the NBL 511. Hence, the cellular DDDMOS transistor 800 can form an isolated power MOSFET and function as a current switch. In one embodiment, all the sources are connected together. In one embodiment, all the polygates are connected together. When all the polygates are set to logic 0, the cellular DDDMOS transistor 800 can be turned off. When all the polygates are set to logic 1, the cellular DDDMOS transistor 800 can be turned on and a current will flow from the drains to the sources. Advantageously, a breakdown voltage (BV) of the cellular DDDMOS transistor 800 can be increased to a higher level (e.g., from 35 volts to 46 volts) while a lower on-resistance can be maintained. An electrostatic discharge (ESD) quality of the cellular DDDMOS transistor 800 can also be improved.

Figure 9:
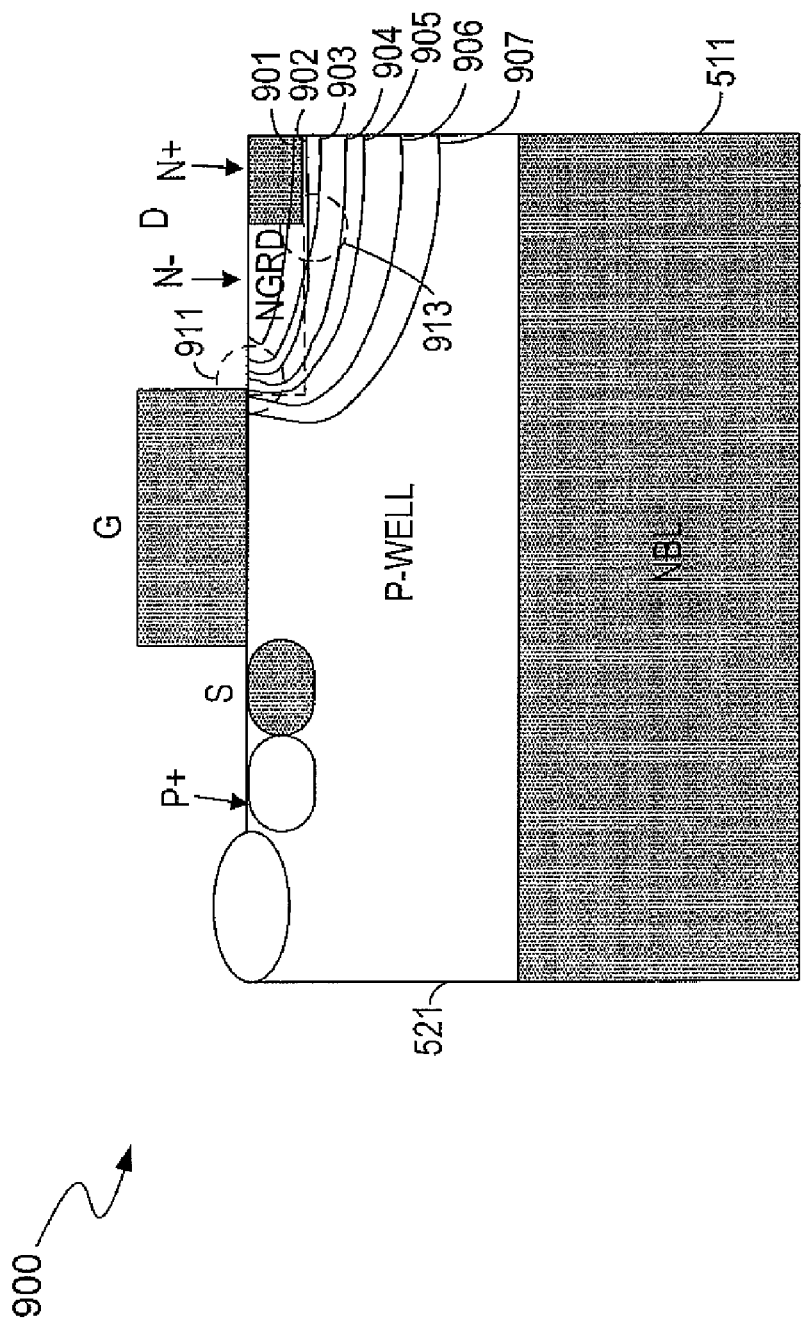
FIG. 9 illustrates a diagram of potential gradients of a cellular DDDMOS transistor, in accordance with one embodiment of the invention.

FIG. 9 illustrates an exemplary diagram 900 of potential gradients of a cellular DDDMOS transistor, e.g., the cellular DDDMOS transistor 700, in accordance with one embodiment of the invention. FIG. 9 is described in combination with FIGS. 7 and 7A.

Under a breakdown voltage (BV) test, potential gradients 901-907 are shown in FIG. 9 when the drain area is biased. In this condition, all the drains of the cellular DDDMOS transistor 700 are not connected to the NBL 511. A breakdown may occur at location 911 or location 913, e.g., at gate edge 911 or at N+ bottom at drain edge 913.

Figure 10:
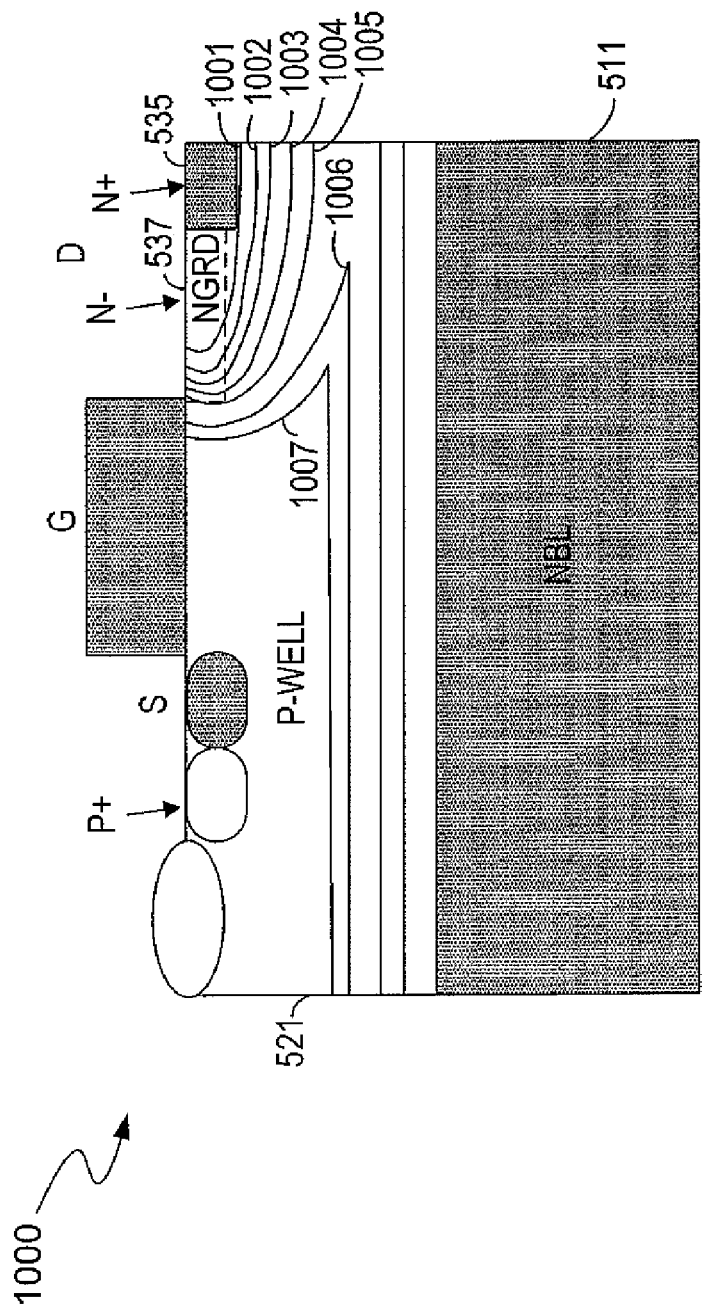
FIG. 10 illustrates an example of a diagram of potential gradients of a cellular DDDDMOS transistor, in accordance with one embodiment of the invention.

FIG. 10 illustrates an example of a diagram 1000 of potential gradients of a cellular DDDMOS transistor, e.g., the cellular DDDMOS transistor 800, in accordance with one embodiment of the invention. FIG. 10 is described in combination with FIG. 8.

A drain area, e.g., all the drains of the cellular DDDMOS transistor 800 are connected to the NBL 511 via the N-well 522/524 and the N+ layer 532/534 as describe above. Hence, the NBL 511 can have substantially the same bias voltage as all the drains. Under a breakdown voltage test, potential gradients 1001-1007 are shown in FIG. 10 when the NBL 511 is biased through the bias voltage of all the drains of the cellular DDDMOS transistor 800. The P-well 521 underneath the drain area can be further depleted by the NBL 511. The depleted P-well around the drain area can produce a higher breakdown voltage. Therefore, the higher the bias voltage at the drain area, the more depleted P-well around the drain area can be achieved, which can result in a higher breakdown voltage.

If the NGRD layer's concentration is relatively low (e.g., approximately between 1.0E12 and 9.0E13 atoms/cm2), the NGRD layer 537 can provide limited charge, and the electric field at the gate edge can be relatively low. The N+ layer 535 at the drain area has more charge and the electric field under the N+ layer 535 can reach a highest level which can cause the breakdown under the N+ layer 535. Advantageously, biasing the NBL 511 through the N-well 522/524 can help improve the breakdown voltage when the NGRD layer's concentration is relatively low. An electrostatic discharge (ESD) quality of the cellular DDDMOS transistor 800 can also be improved.

Additionally, when the cellular DDDMOS transistor 800 is biased up to breakdown, e.g., when the bias voltage at the drain area increases to the breakdown voltage, the cellular DDDMOS transistor 800 would not be damaged. In one embodiment, when the biasing voltage is re-set to zero, the cellular DDDMOS transistor 800 is still intact. In one embodiment, as a result of connecting all the drains of the cellular DDDMOS transistor 800 to the NBL 511 via the N-well 522/524 and the N+ layer 532/534, the voltage level of all the drains can be substantially the same with that of the NBL 511, the N-well 522/524, and the N+ layer 532/534. Therefore, when there is overshot noisy voltage coming to attack the cellular DDDMOS transistor 800 at the drains during the normal operating period, the breakdown would occur first at N-well to P-well (e.g., the N-well 522/524 to the P-well 523/525), instead of the cellular DDDMOS transistor itself (e.g., between the drain area and the source area), thus avoiding inducing triggering the built-in NPN bipolar and avoiding damage to the cellular DDDMOS transistor 800, in one embodiment. The N-well to P-well can act as a body diode protecting the cellular DDDMOS transistor 800 when an unexpected overshot noisy voltage coming to attack the cellular DDDMOS transistor 800.

Figure 11:
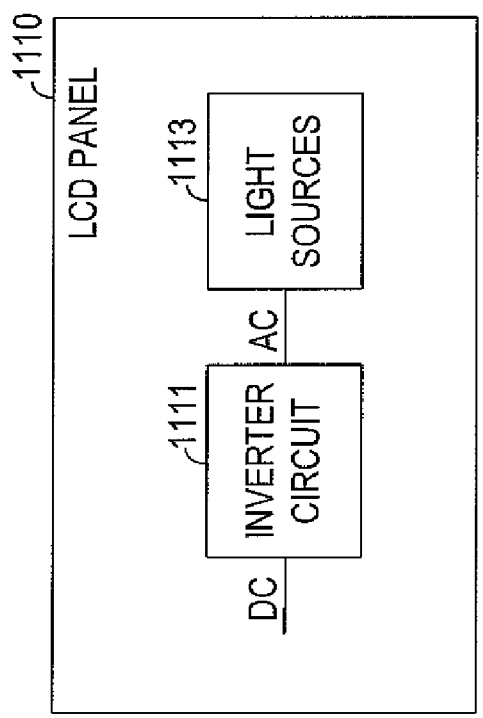
FIG. 11 illustrates a diagram of a display system, in accordance with one embodiment of the invention.

FIG. 11 illustrates a diagram of a display system 1100, in accordance with one embodiment of the invention. The display system 1100 can include a liquid crystal display (LCD) panel 1110, in one embodiment. An inverter circuit 1111 can be used to convert a DC voltage from a power source (not shown) to an AC voltage so as to power multiple light sources 1113 for illuminating the LCD panel 1110. The inverter circuit 1111 can include an inverter controller and one or more switches. In one embodiment, the inverter circuit 1111 can be integrated into an IC similar to the structure shown in FIG. 1 including a controller circuitry 110 and one or more switches 120.

In one embodiment, the switch 120 can be, but is not limited to, any of aforementioned transistors. For example, the switch 120 can employ a cellular DDDMOS transistor (e.g. 800 in FIG. 8) including the structure of the DDDMOS transistor e.g., 500 or 600 shown in FIG. 5 or FIG. 6.

Accordingly, the switch 120 and the controller circuitry 110 for controlling the switch are integrated on the single IC 100, in one embodiment. The cellular transistor (e.g., the cellular DDDMOS transistor 800) with the structure of a DDDMOS transistor 400/500/600 can be employed as the switch 120. The cellular DDDMOS transistor 800 can include the NBL 511, the N-well 522/524 connected to the NBL 511, and the N+ layer 532/534 connected to the N-well 522/524. The cellular DDDMOS transistor 800 can also include multiple drains, multiple sources and multiple polygates. In one embodiment, all the drains of the cellular DDDMOS transistor 800 are connected to the NBL 511 via the N+ layer 532/534 and the N-well 522/524. Hence, the cellular DDDMOS transistor 800 can act as an isolated MOS transistor. Advantageously, a breakdown voltage (BV) of the cellular DDDMOS transistor 800 can be improved to a higher level while a lower on-resistance can be maintained. An electrostatic discharge (ESD) quality of the cellular DDDMOS transistor 800 can also be improved. The types of transistors used in the controller circuitry 110 and the switch 120 are not limited to those exemplary transistors mentioned previously, and other types of transistor within the sprit and scope of the invention can also be used therein.

While the foregoing description and drawings represent embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. A cellular transistor, comprising:
an N-type heavily doped (N+) buried layer (NBL);
an N-well connected to said NBL and formed after formation of said NBL;
a first N+ layer connected to said N-well and formed after formation of said N-well;
a P-well partially surrounded by said NBL and said N-well;
a plurality of drains formed on and adjacent to said P-well, wherein each drain of said drains comprises a second N+ layer and is connected to said NBL via said N-well and said first N+ layer; and
a source formed on said P-well, wherein said source comprises a third N+ layer configured to form a conducting channel between said second N+ layer of said each drain and said third N+ layer of said source,
wherein a breakdown voltage of said cellular transistor increases if a drain voltage at said drains increases.

2. The cellular transistor of claim 1, wherein said each drain of said drains comprises an N-type grade (NGRD) layer surrounding said second N+ layer.

3. The cellular transistor of claim 2, wherein a depth of said second N+ layer is less than that of said NGRD layer, and wherein a density of said second N+ layer is greater than that of said NGRD layer.

4. The cellular transistor of claim 2, wherein said NGRD layer is formed at an implant dose that is approximately between 1.0E12 and 9.0E13 atoms/cm2.

5. The cellular transistor of claim 1, further comprising:
a plurality of sources, wherein all of said sources are connected together.

6. The cellular transistor of claim 1, further comprising:
a plurality of polygates, wherein all of said polygates are connected together.

7. The cellular transistor of claim 6, where a field oxide layer is formed between each poly gate and said each drain.

8. The cellular transistor of claim 7, wherein said each drain comprises an N-type grade (NGRD) layer surrounding said second N+ layer, and wherein said field oxide layer is formed adjacent to said second N+ layer.

9. The cellular transistor of claim 1, wherein said breakdown voltage comprises a drain to source breakdown voltage between a drain of said drains and a source of said cellular transistor.

10. The cellular transistor of claim 1, wherein said P-well underneath said drains is depleted by said NBL if said drain voltage is applied at said drains.

11. The cellular transistor of claim 1, wherein said P-well is formed on said NBL and adjacent to said N-well.

12. An integrated circuit (IC), comprising:
a switch comprising a cellular transistor, wherein said cellular transistor comprises:
an N-type heavily doped (N+) buried layer (NBL);
an N-well connected to said NBL and formed after formation of said NBL;
a first N+ layer connected to said N-well and formed after formation of said N-well;
a P-well partially surrounded by said NBL and said N-well;
a plurality of drains formed on and adjacent to said P-well, wherein each drain of said drains comprises a second N+ layer and is connected to said NBL via said N-well and said first N+ layer; and
a source formed on said P-well, wherein said source comprises a third N+ layer configured to form a conducting channel between said second N+ layer of said each drain and said third N+ layer of said source,
wherein a breakdown voltage of said cellular transistor increases if a drain voltage at said drains increases; and
controller circuitry coupled to said switch and operable for controlling said switch.

13. The IC of claim 12, wherein said each drain of said drains comprises an N-type grade (NGRD) layer surrounding said N+ layer.

14. The IC of claim 13, wherein a depth of said second N+ layer is less than that of said NGRD layer, and wherein a density of said second N+ layer is greater than that of said NGRD layer.

15. The IC of claim 13, wherein said NGRD layer is formed at an implant dose that is approximately between 1.0E12 and 9.0E13 atoms/cm2.

16. The IC of claim 12, wherein said cellular transistor further comprises:
a plurality of sources, wherein all of said sources are connected together.

17. The IC of claim 12, wherein said cellular transistor further comprises:

a plurality of polygates, wherein all of said polygates are connected together.

18. The IC of claim 17, wherein a field oxide layer is formed between each polygate and said each drain.

19. The IC of claim 18, wherein said each drain comprises an N-type grade (NGRD) layer surrounding said second N+ layer, and wherein said field oxide layer is formed adjacent to said second N+ layer.

20. The IC of claim 12, wherein said cellular transistor comprises a double diffused drain metal oxide semiconductor (DDDMOS) transistor.

21. The IC of claim 12, wherein said controller circuitry comprises a plurality of lateral diffused metal oxide semiconductor (LDMOS) transistors.

22. The IC of claim 12, wherein said breakdown voltage comprises a drain to source breakdown voltage between a drain of said drains and a source of said cellular transistor.

23. The IC of claim 12, wherein said P-well underneath said drains is depleted by said NBL if said drain voltage is applied at said drains.

24. The IC of claim 12, wherein if said controller circuitry sets a polygate of said cellular transistor to logic 1, a current flows from a drain of said drains to a source of said cellular transistor.

25. The IC of claim 12, wherein said P-well is formed on said NBL and adjacent to said N-well.

* * * * *